United States Patent
Drago

(10) Patent No.: US 9,077,361 B1
(45) Date of Patent: Jul. 7, 2015

(54) PHASE ESTIMATOR

(71) Applicant: NXP B.V., Eindhoven (NL)

(72) Inventor: Salvatore Drago, Eindhoven (NL)

(73) Assignee: NXP B.V., Eindhoven (NL)

( * ) Notice: Subject to any disclaimer, the term of this patent is extended or adjusted under 35 U.S.C. 154(b) by 35 days.

(21) Appl. No.: 14/551,904

(22) Filed: Nov. 24, 2014

(30) Foreign Application Priority Data

Dec. 24, 2013 (EP) .................................. 13199552

(51) Int. Cl.
| | |
|---|---|
| *H03M 1/12* | (2006.01) |
| *H03M 1/08* | (2006.01) |
| *H03M 1/00* | (2006.01) |
| *H03M 1/18* | (2006.01) |
| *H03M 1/46* | (2006.01) |
| *H03M 1/38* | (2006.01) |

(52) U.S. Cl.
CPC ............ *H03M 1/0836* (2013.01); *H03M 1/002* (2013.01); *H03M 1/1245* (2013.01); *H03M 1/182* (2013.01); *H03M 1/462* (2013.01); *H03M 1/46* (2013.01); *H03M 1/38* (2013.01)

(58) Field of Classification Search
CPC ......... H03M 1/38; H03M 1/46; H03M 1/462; H03M 1/0836; H03M 1/002; H03M 1/182; H03M 1/1245
USPC .......................................... 341/122, 155, 172
See application file for complete search history.

(56) References Cited

U.S. PATENT DOCUMENTS

| | | | | |
|---|---|---|---|---|
| 5,581,252 | A * | 12/1996 | Thomas ......................... | 341/144 |
| 6,424,284 | B1 * | 7/2002 | Lopata et al. ................. | 341/163 |
| 6,559,789 | B1 * | 5/2003 | Somayajula .................. | 341/172 |
| 8,344,925 | B1 * | 1/2013 | Evans ............................ | 341/155 |
| 8,659,463 | B2 * | 2/2014 | Cho et al. ...................... | 341/163 |

OTHER PUBLICATIONS

Masuch, J. et al. "A 190-μW zero-IF GFSK Demodulator With a 4-b Phase-Domain ADC," IEEE J. on Solid-State Circuits, vol. 47. No. 11, pp. 2796-2806 (Nov. 2012).
Elshazly, A. et al. "A 13b 315fs$_{rms}$ 2mW 500MS/s 1MHz bandwidth highly digital time-to-digital converter using switched ring oscillators", IEEE Intl. Solid-State Circuits Conf. Digest of Technical Paper, pp. 464-466, (Feb. 2012).
Soer, M. et al. "A 1.5-to-5.0GHz Input-Matched +2dBm P$_{1dB}$ All-Passive Switched-Capacitor Beamforming Receiver Front-End in 65nm CMOS", IEEE Intl. Solid-State Circuits Conf. Digest of Technical Paper, pp. 174-176 (Feb. 2012).
Sanaa, W. et al. "Design of a Mixed-Signal Cartesian Feedback Loop for a Low Power Zero-IF WCDMA Transmitter", IEEE Third Latin American Symp. on Circuits and Systems, 4 pgs. (2012).

(Continued)

*Primary Examiner* — Khai M Nguyen

(57) ABSTRACT

A phase estimator comprising a first input terminal configured to receive a first analog input signal; a second input terminal configured to receive a second analog input signal, wherein the second analog input signal is 90° out of phase with the first analog input signal. The phase estimator is configured to provide a digital word representative of the phase of the first analog input signal and the second analog input signal. The phase estimator comprises a register configured to store N bits as a digital word a first reference signal generator, a second reference signal generator and a comparator.

15 Claims, 12 Drawing Sheets

(56) References Cited

OTHER PUBLICATIONS

Figure 1:
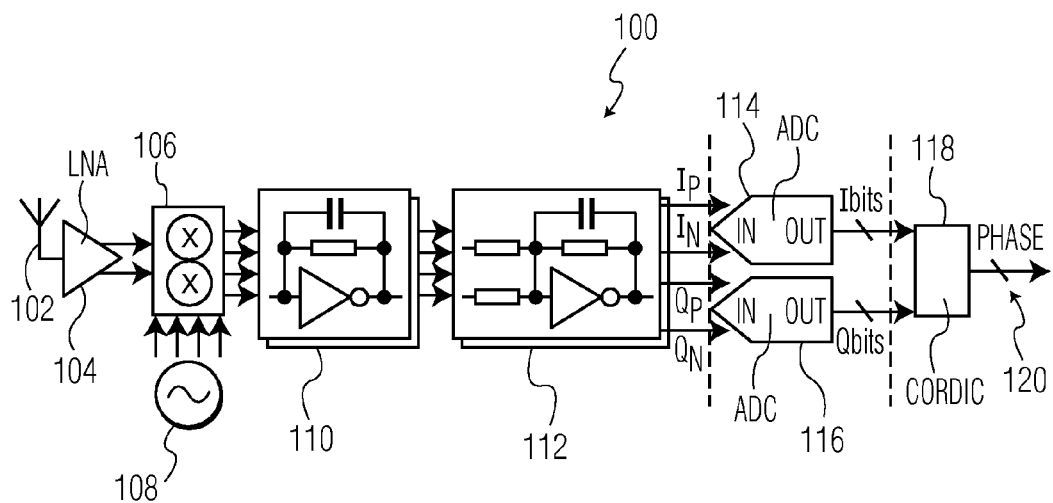

Saputra, N. et al. "A Fully-Integrated, Short-Range, Low Data Rate FM-UWB Transmitter in 90 nm CMOS", IEEE J. of Solid-State Circuits, vol. 46, No. 7, pp. 1627-1635 (Jul. 2011).

van Elzakker, M. et al. "A 1.9μW 4.4fJ/Conversion-step 10b 1MS/s Charge-Redistribution ADC", IEEE Intl. Solid-State Circuits Conf. Digest of Technical Paper, 3 pgs. (Feb. 2008).

Sauerbrey, J. et al. "A 0.5-V 1-μW Successive Approximation ADC", IEEE J. of Solid-State Circuits, vol. 38, No. 7, pp. 1261-1265 (Jul. 2003).

Volder, J. E. "The CORDIC Trigonometric Computing Technique", IRE Transactions on Electronic Computers, pp. 330-334 (Sep. 1959).

Extended European Search Report for EP Patent Appln. No. 13199552.4 (May 27, 2014).

* cited by examiner

PHASE ESTIMATOR

This disclosure relates to a phase estimator, and in particular, although not necessarily to a phase estimator that can perform a binary search in order to provide a digital output signal representative of the phase of received analogue input signals.

According to a first aspect of the invention there is provided a phase estimator comprising:

a first input terminal configured to receive a first analogue input signal;

a second input terminal configured a second analogue input signal, wherein the second analogue input signal is 90° out of phase with the first analogue input signal;

a register configured to store N bits as a digital word, where N is greater than one, the register comprising a register input terminal that is connectable to each of the bits in accordance with a pointer value, and a register output terminal configured to provide the digital word;

a first reference signal generator configured to receive the digital word from the register and the first analogue signal, and provide a first analogue reference signal as the product of the first analogue signal and $\sin(2\pi*\text{digital word})$;

a second reference signal generator configured to receive the digital word from the register and the second analogue signal, and provide a second analogue reference signal as the product of the second analogue signal and $\cos(2\pi*\text{digital word})$;

a comparator configured to compare the first analogue reference signal with the second analogue reference signal and provide to the input terminal of the register a binary feedback signal in accordance with the result of the comparison; and wherein the output terminal of the register is configured to provide the digital word, wherein the digital word is representative of the phase of the first analogue input signal and the second analogue input signal.

The phase estimator may be configured to set the pointer value to the most significant bit in the digital word, set the digital word to a default word, and then repeatedly:

a) write the binary feedback signal to a bit in the register in accordance with the pointer value;

b) increment the pointer value;

c) for the bit in the register identified by the pointer value, set the bit as a default bit value;

d) provide a new first analogue reference signal and a new second analogue reference signal in accordance with the digital word stored in the register; and e) compare the new first analogue reference signal with the new second analogue reference signal in order to provide to the input terminal of the register a binary feedback signal.

The phase estimator may be further configured to repeat steps a) to e) at a frequency equal to the product of a sampling frequency and N. The output terminal of the register may be configured to update the digital word at a frequency equal to the inverse of a sampling period.

The most significant bit of the default word may be 1. All other bits of the default word may be zero. The default bit value may be 1.

The phase estimator may further comprise a first sample-and-hold component and a second sample-and-hold component. The first sample-and-hold component may have an input terminal that is connected to the first input terminal and an output terminal that is configured to provide a first time-discrete continuous-amplitude signal to the first reference signal generator. The second sample-and-hold component may have an input terminal that is connected to the second input terminal and an output terminal that is configured to provide a second time-discrete continuous-amplitude signal to the second reference signal generator.

The first sample-and-hold component and the second sample-and-hold component may be configured to be clocked by a clock signal with a frequency equal to a sampling frequency.

The first reference signal generator may be a digital to analogue converter. The second reference signal generator may be a digital to analogue converter.

The first reference signal generator may comprise a first digitally-controlled charge redistribution voltage divider configured to implement a sine function approximation. The first digitally-controlled charge redistribution voltage divider may comprise a first digitally controlled variable capacitor. The first digitally controlled variable capacitor may be configured to provide a capacitance value of $\phi C$, where $\phi$ is the digital word that is stored in the register. The first digitally controlled variable capacitor may comprise a first binary-weighted capacitor bank. The first digitally-controlled charge redistribution voltage divider may comprise a first fixed capacitor, which can have a fixed value of about 1.8C. This can minimise, or reduce to an acceptably low level, phase error in the estimation.

The second reference signal generator may comprise a second digitally-controlled charge redistribution voltage divider configured to implement a cosine function approximation. The second digitally-controlled charge redistribution voltage divider may comprise a second digitally controlled variable capacitor. The second digitally controlled variable capacitor may be configured to provide a capacitance value of $\overline{\phi}C$, where $\overline{\phi}$ is the inverse of the digital word that is stored in the register. The second digitally controlled variable capacitor may comprise a second binary-weighted capacitor bank. The second digitally-controlled charge redistribution voltage divider may comprise a second fixed capacitor, which can have a fixed value of about 1.8C. This can minimise, or reduce to an acceptably low level, phase error in the estimation.

The first reference signal generator may comprise a first digitally-controlled resistive voltage divider configured to implement a sine function approximation. The first digitally-controlled resistor voltage divider may comprise a first digitally controlled variable resistor and optionally a first fixed resistor. The first digitally controlled variable resistor may be configured to provide a resistor value of $\phi R$, where $\phi$ is the digital word that is stored in the register. The first fixed resistor may have a fixed value of about 1.8R. The first digitally controlled variable resistor may comprise a first binary-weighted resistor array.

The second reference signal generator may comprise a second digitally-controlled resistive voltage divider configured to implement a cosine function approximation. The second digitally-controlled resistive voltage divider may comprise a second digitally controlled variable resistor and optionally a second fixed resistor. The second digitally controlled variable resistor may be configured to provide a resistor value of $\overline{\phi}R$, where $\overline{\phi}$ is the inverse of the digital word that is stored in the register. The second fixed resistor may have a fixed value of about 1.8R.

There may be provided an RF tuner comprising any phase estimator disclosed herein.

There may be provided an RPM sensor comprising any phase estimator disclosed herein.

There may be provided a computer program, which when run on a computer, causes the computer to configure any apparatus, including a circuit, controller, converter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

Figure 2:
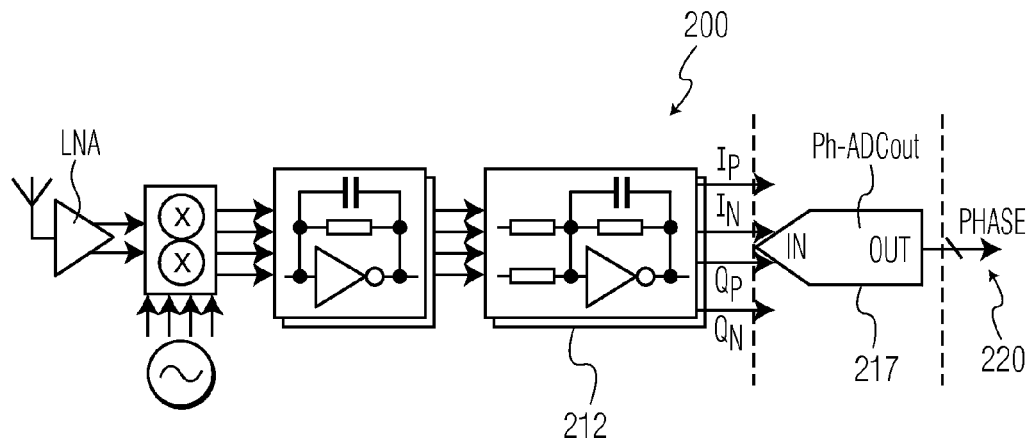
Figure 3:
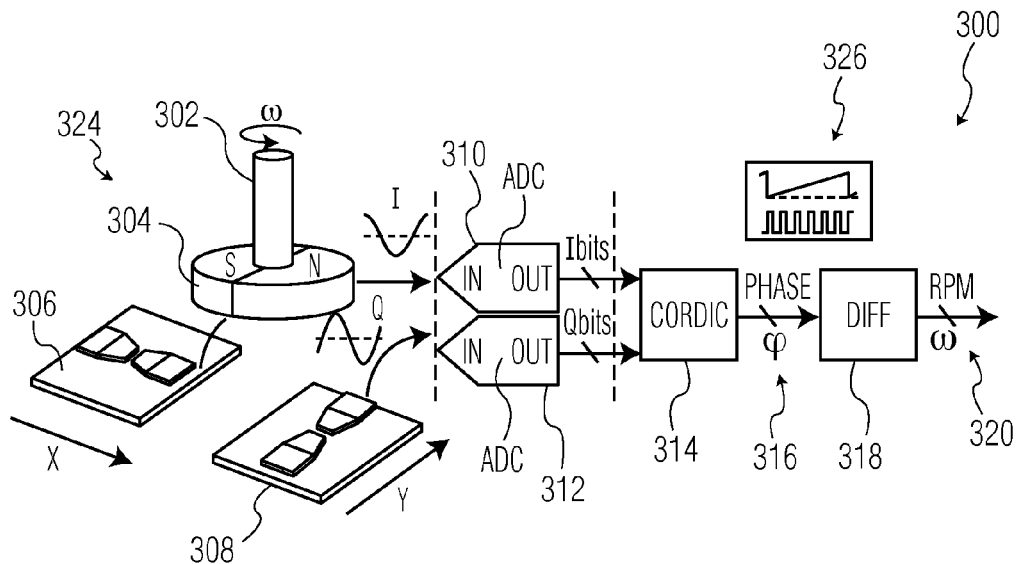
Figure 4:
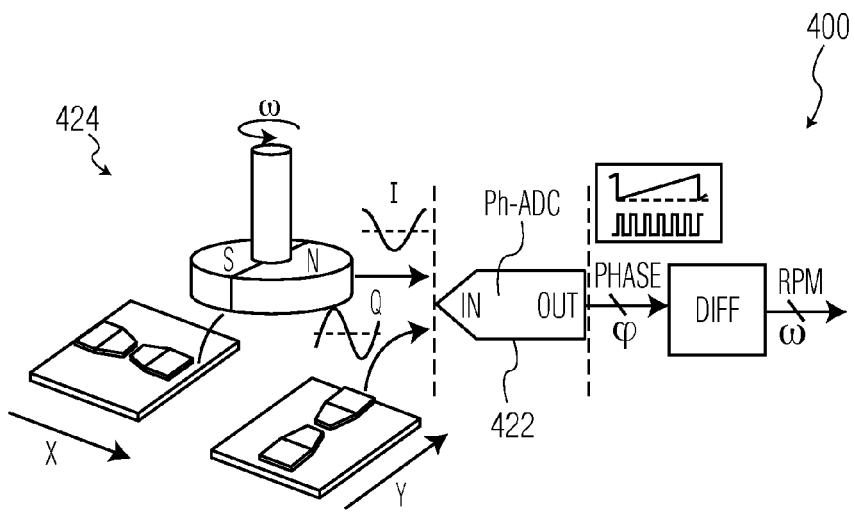
Figure 5:
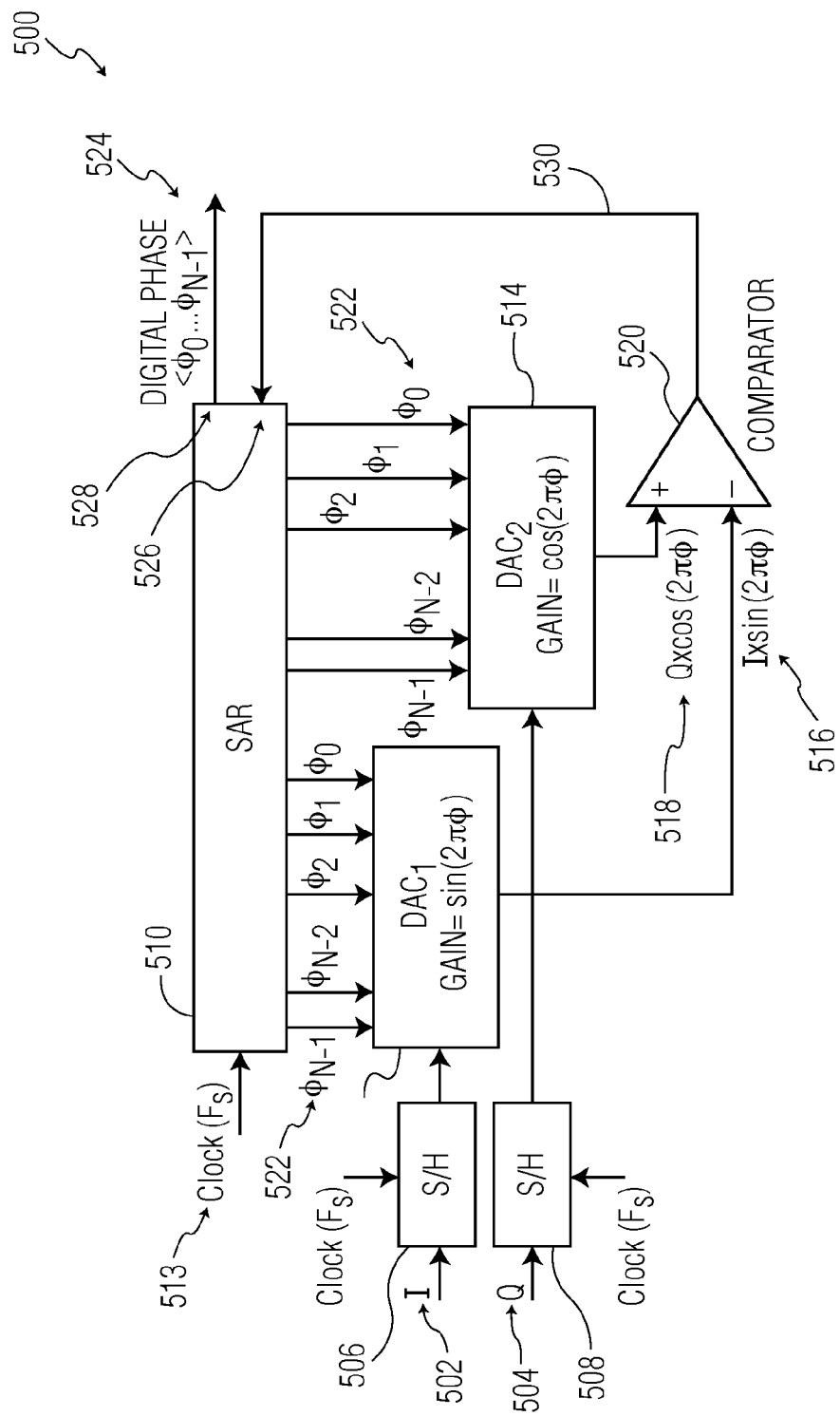
Figure 6A:
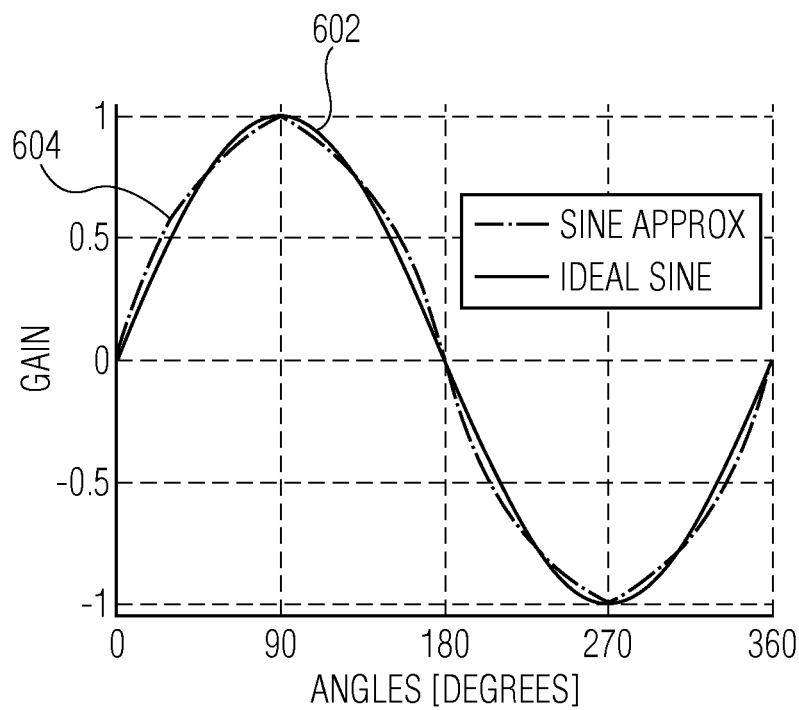
Figure 6B:
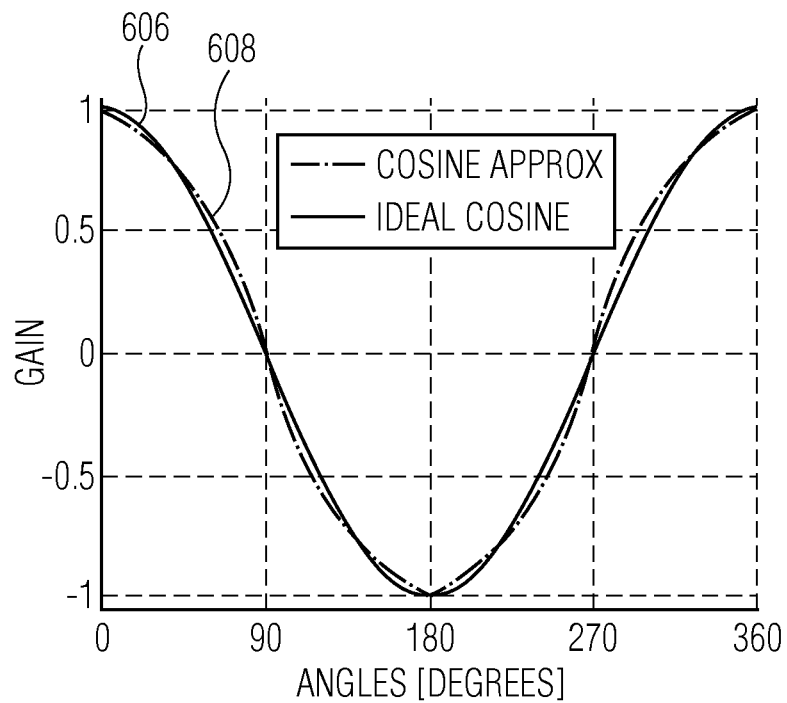
Figure 7A:
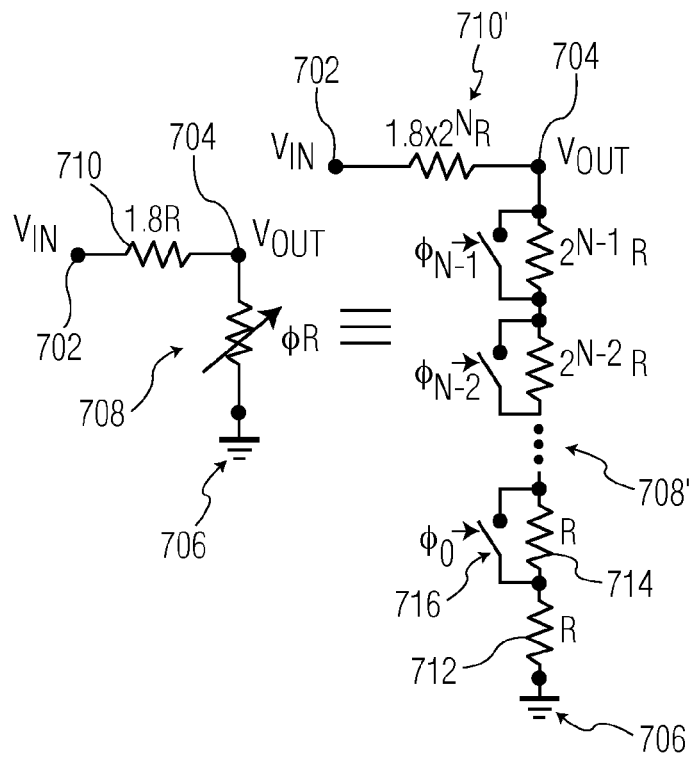
Figure 7B:
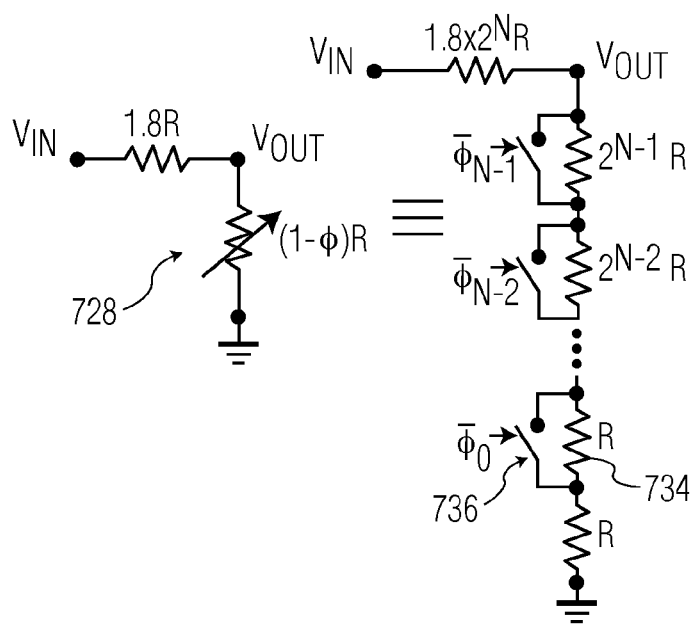
Figure 8A:
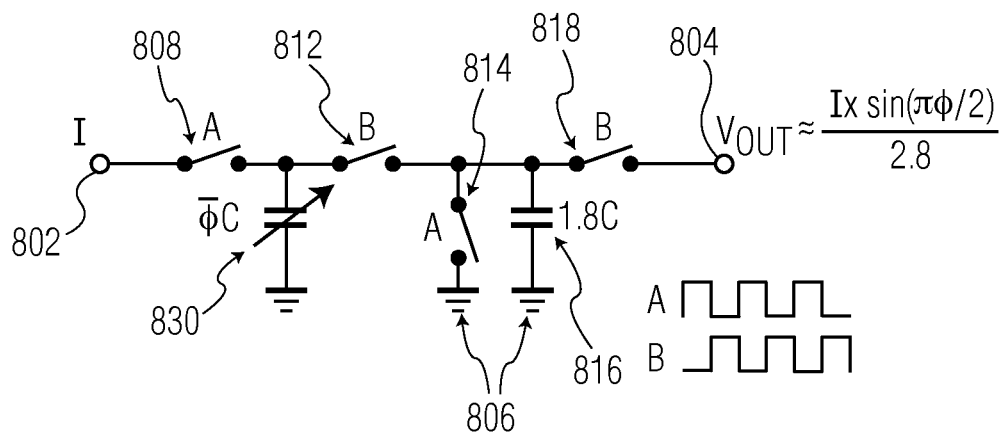
Figure 8B:
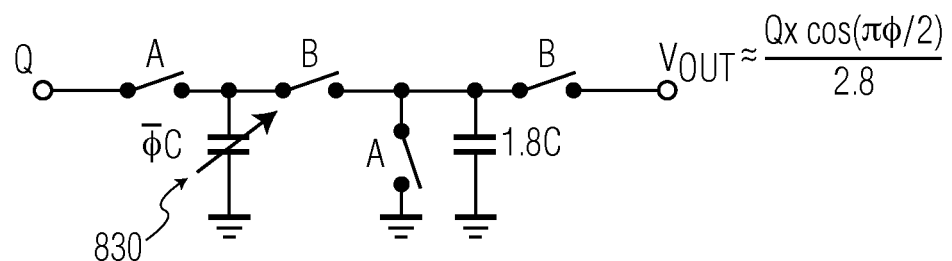
Figure 9:
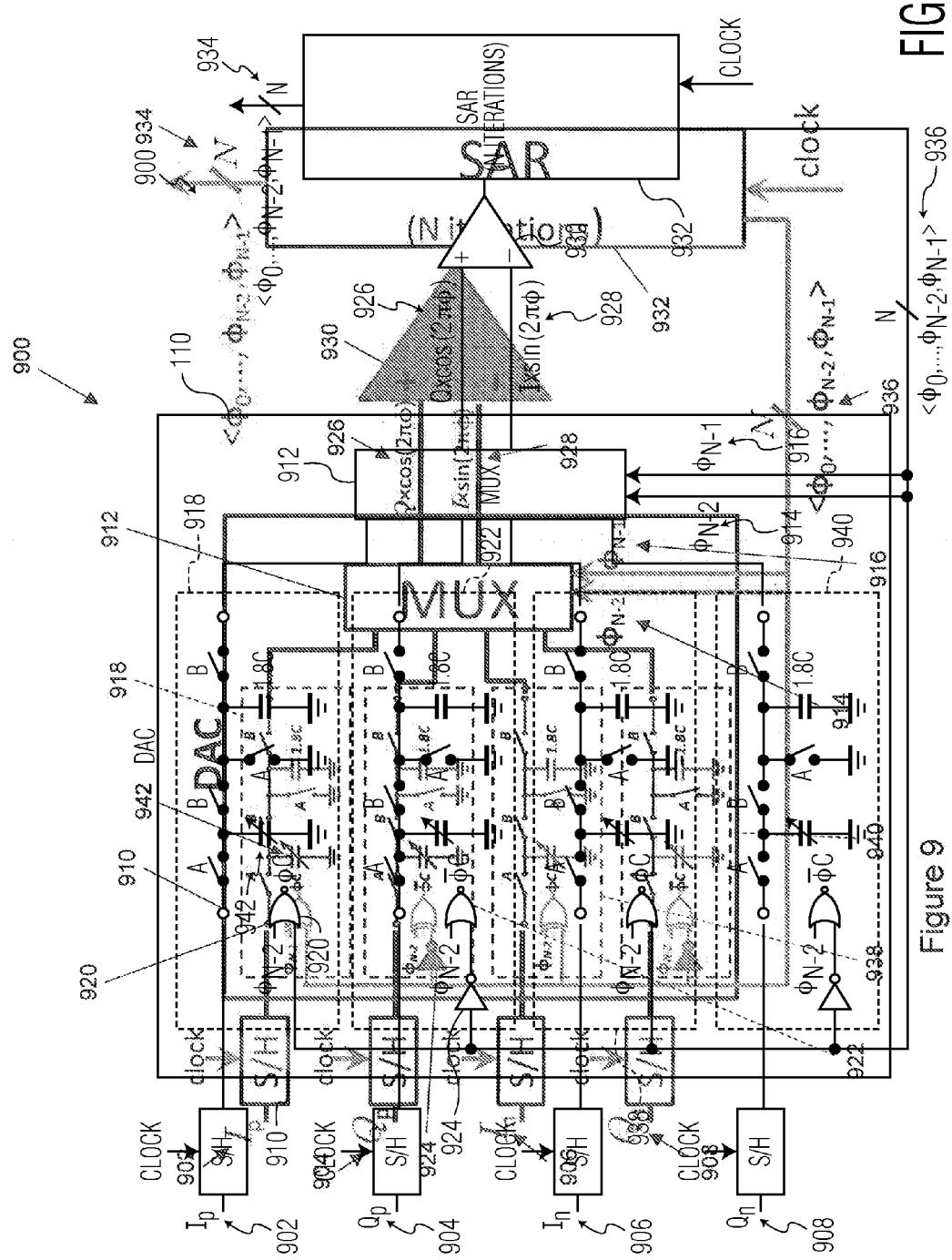
Figure 11:
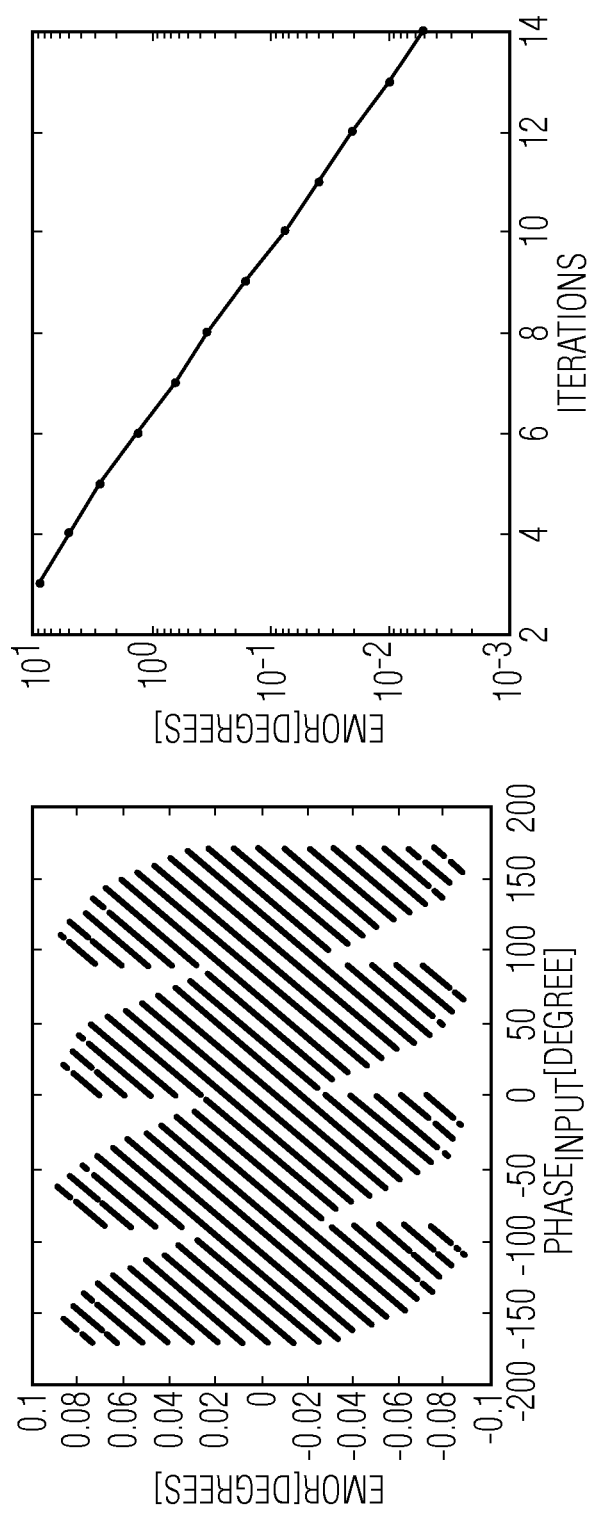
Figure 12:
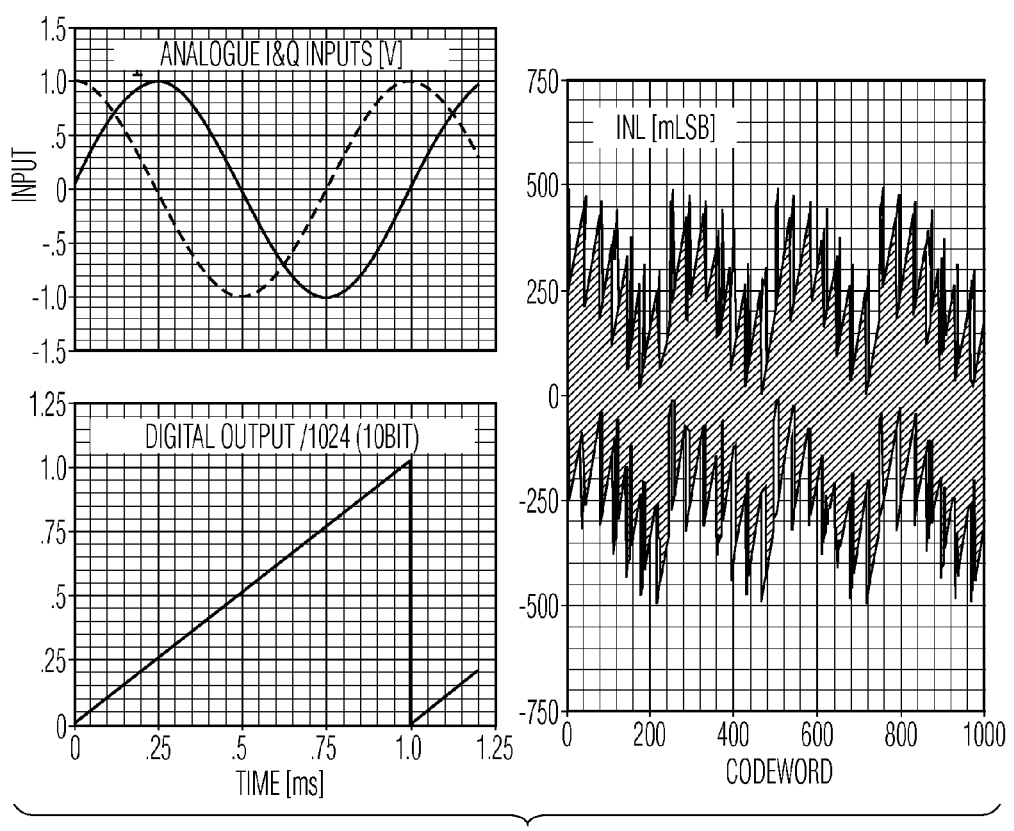

Embodiments will now be described by way of example with reference to the accompanying figures, in which:

FIG. 1 shows an RF communications receiver;
FIG. 2 shows another RF receiver;
FIG. 3 shows an RPM sensor;
FIG. 4 shows another RPM sensor
FIG. 5 shows a phase estimator;
FIGS. 6a and 6b show graphically sine and cosine approximations;
FIGS. 7a and 7b illustrate digitally-controlled resistive voltage dividers;
FIGS. 8a and 8b illustrate digitally-controlled charge redistribution voltage dividers;
FIG. 9 shows another phase estimator;
FIGS. 10a to 10e show the results of simulations that were performed on the phase estimator of FIG. 9;
FIG. 11 shows the results of more simulations of the phase estimator of FIG. 9; and
FIG. 12 shows circuit level simulations of the phase estimator of FIG. 9, with a 10-bit digital word.

Phase estimators disclosed in this document can be used both in ultra-low power RF (radio frequency) tuners and in RPM (revolutions-per-minute) magnetic sensors. Systems that relate to both of these applications are described below.

FIG. 1 shows an RF communications receiver 100. In the context of low packet-rate ultra-low-power radios in particular, significant energy can be spent in synchronizing the receiver 100 with the incoming transmitted packet. The receiver 100 of FIG. 1 decodes the received signal phase in order to synchronize the receiver to the transmitted symbols and to demodulate the received signal properly.

The receiver 100 of FIG. 1 includes an antenna 102 that receives a signal from a transmitter (not shown). The antenna is connected to the input of a low noise amplifier (LNA) 104. The LNA 104 has two output terminals that provide a positive and a negative signal as differential signalling. The output terminals of the LNA 104 are connected to input terminals of an in-phase/quadrature (I/O) mixer 108. The I/Q mixer 106 multiplies the output signals from the LNA 104 by a local oscillator signal received from a frequency synthesizer, or any other clock. More particularly, the I/O mixer 106 multiplies differential output signal from the LNA 104 by a first local oscillator differential signal and a second local oscillator differential signal, wherein the second local oscillator signal is 90° out of phase with the first oscillator signal. In this way, the I/Q mixer 106 down-converts the received RF signal into baseband and outputs one differential analogue in-phase (I) signal and one differential analogue quadrature (Q) signals at the intermediate frequency (IF). The one differential analogue I signal consists of a +I signal and a −I signal. Similarly, the differential analogue Q signal consists of a +Q signal and a −Q signal. The output signals from the I/O mixer 106 are then amplified by an IF amplifier 110 and filtered by an anti-aliasing filter 112 in order to provide four analogue signals: an in-phase positive signal $I_P$, an in-phase negative signal $I_N$, a quadrature positive signal $Q_P$, and a quadrature negative signal $Q_N$. The LNA 104, the I/O mixer 106, the IF amplifier 110 and the anti-aliasing filter 112 may be considered together as an analogue front-end.

The in-phase positive signal $I_P$ and the in-phase negative signal IN are processed by an in-phase ADC 114 in order to provide a digital representation of the in-phase signal as I bits. Similarly, the quadrature positive signal $Q_P$ and the quadrature negative signal $Q_N$ are processed by a quadrature ADC 116 in order to provide a digital representation of the quadrature signal as Q bits. Since the signals in-phase and quadrature signals are generated in the analogue domain and the phase extraction will be performed in the digital domain, two ADCs 114, 116 are needed.

A CORDIC digital core 118 receives the I bits signal from the in-phase ADC 114 and the Q bits signal from the quadrature ADC 116 and provides a digital output signal 120 that is representative of the in-phase and quadrature signals in the digital domain. As is known in the art, the CORDIC digital core 118 applies a CORDIC algorithm, which was first described in 1959 by Jack E. Voider.

The receiver 100 of FIG. 1 can provide fast synchronization and easy phase demodulation, which can involve high phase resolution requirements for both the ADCs 114, 116 and the CORDIC 118. Although this system can achieve high phase accuracy, it may require large silicon area and have high power consumption.

FIG. 2 shows another RF receiver 200. Components of FIG. 2 that have already been described with reference to FIG. 1, will not necessarily be described again here. The RF receiver 200 is a low-power and low-cost solution. The analogue front-end of the receiver 200 is the same as that described above with reference to FIG. 1.

The outputs of the anti-aliasing filter 212 are provided as inputs to a phase ADC 217. The output of the phase ADC 217 is a digital signal 220 representative of the phase of the in-phase and quadrature signals. The phase ADC 217 is an analogue-to-digital converter that transforms the analogue input phase $\phi = a\tan(Q/I)$ into its digital representation, $<\phi_0: \phi_{(N-1)}>$, where N is the resolution of the phase ADC 217. Such phase-domain ADCs are known in the art.

When compared with the receiver of FIG. 1, the phase extraction process of FIG. 2 is moved from the digital domain to the mixed-signal domain. This results into reduced silicon area for components in both the digital and the mixed-signal domains because only one ADC is required and very little digital signal processing is needed for the received of FIG. 2. Moreover, the approach of FIG. 2 can be beneficial in terms of power consumption since it is requires only one ADC 217 instead of two and it avoids the use of a CORDIC.

Phase-domain ADCs 217 are known in the art, and can be implemented using a flash ADC architecture. However, flash ADCs can provide very poor phase accuracy which can result in both poor synchronization and poor demodulation sensitivity. Higher phase resolutions can be achieved by using a sigma-delta phase ADC followed by a decimation filter in the digital domain. However, such systems can require a large amount of power and can have a relatively slow conversion speed, which can make this system not attractive for ultra-low-power radio when compared with the system of FIG. 1.

FIG. 3 shows an RPM sensor 300, which is a device measuring the rotation speed of a shaft 302 or disk referred to as rotor, for example in a motor or other rotational machine. The shaft 302 has a magnet 304 mounted to it. RPM sensors are known to output the sensed revolutions per minute (RPM) as either an analogue or digital signal. A digital output signal can be preferred in some applications due to its robustness to noise/interferes and immunity to common mode fluctuation. The RPM sensor of FIG. 3 outputs a digital signal 320 representative of the sensed value for RPM ω.

The RPM sensor 320 consists of a sensor front-end 324, followed by a digital signal processing back-end 326. The front-end 324 comprises two magnetic sensors 306, 308 at orthogonal orientations relative to each other in the vicinity of the magnet 304 on the shaft 302. The two magnetic sensors 306, 308 sense the magnetic field generated by the magnet 304 and generate two different analogue voltage signals I and Q.

The analogue voltage signals I and Q are two sinusoidal waveforms with an angular frequency ω, which is proportional to the shaft revolution per second. Due to the relative orientation of the two magnetic sensors 306, 308, the analogue voltage signals I and Q are 90° out-of-phase with each other. Therefore, the analogue voltage signals I and 0 have the same relative properties as the in-phase and quadrature signals that are described above with reference to RF receivers. The RPM of the shaft 302 can be derived by the simple equation:

$$RPM = \frac{60}{2\pi} \frac{d}{dt}\left(a\tan\left(\frac{Q}{I}\right)\right) \quad (1)$$

Equation (1) can be easily realized by digitizing the I and Q signal with respective amplitude ADCs 310, 312 followed by a digital CORDIC 314 which converts the two digitized amplitudes into a digital representation φ of the analogue phase φ=a tan(Q/I) 316. The RPM value 420 can then be determined by a differentiator 418 that differentiates the digital phase signal 316, for example by calculating the phase difference from one CORDIC output to the next. If the ADC conversion rate is $F_s$, the shaft RPM at the time t=nT=n/$F_s$ is given by:

$$RPM(n) = 60F_s \frac{\phi(n) - \phi(n-1)}{2^N} \quad (2)$$

where N is the number of bits of the digital CORDIC 314, which is the system phase resolution. Although the RPM sensor 300 of FIG. 3 can achieve high RPM accuracy, it may also require large silicon area and have high power consumption.

FIG. 4 shows another RPM sensor 400. Components of FIG. 4 that have already been described with reference to FIG. 3, will not necessarily be described again here. When compared with the RPM sensor of FIG. 3, the silicon area of the RPM sensor 400 has been reduced by cascading the magnetic sensor front-end 424 with a phase ADC 422. As with the RF tuners examples described above, the phase extraction process is moved from the digital domain to the mixed-signal domain. Again, less silicon area is required due to the use of one single phase ADC 422. Also, very simple digital logic can be required to differentiate the phase φ. Additionally, the RPM sensor 400 of FIG. 4 can be beneficial in terms of power consumption since it is required only one ADC instead of two and no digital CORDIC. However, from equation (2) it follows that, for high RPM accuracy and high dynamic range, the phase ADC 422 requires with both a high conversion rate $F_s$ and a high resolution N.

Known flash phase ADCs 422 can lack in achievable resolution while sigma-delta phase ADCs can be limited by their relative low conversion rate. A high-resolution and high-conversion-rate sigma-delta phase ADC would require unacceptably high power consumption compared to the CORDIC approach of FIG. 3. For this reason use of the RPM sensor of FIG. 4 may not be attractive for some applications.

FIG. 5 shows a phase estimator 500 that has low power consumption, requires less silicon area than prior art systems yet has an acceptably high resolution. The phase estimator 500 can perform a phase binary search in the complex plane in order to provide a digital output signal representative of the phase of received analogue input signals.

The phase estimator 500 includes a first input terminal 502 that receives a first analogue input signal. In this example, the first analogue input signal is an in-phase signal. The phase estimator 500 also includes a second input terminal 504 that receives a second analogue input signal. The second analogue input signal is 90° out of phase with the first analogue input signal. In this example, the second analogue input signal is a quadrature signal.

The phase estimator 500 also includes a register 510 that can store an N bit digital word/code, where N is greater than one. The digital word can be represented as $\phi=(2^0\phi_0 + 2^1\phi_1 + \ldots + 2^{N-1}\phi_{N-1})/2^N$ with $\phi \in [0,1)$. The register 510 may be referred to as a successive approximation register (SAR) as it provides functionality that is similar to that provided by the register in successive approximation ADCs. As will be described in more detail below, the number of bits N in the digital word will contribute to the resolution of the phase estimation. The register 510 has a register input terminal 526 that is connectable to each of the bits N of the digital word in accordance with a pointer value. In this way, a binary value that is received at the register input terminal 526 can be written into a specific bit of the digital word in accordance with the pointer value. The register 510 has a register output terminal 528 configured to provide the digital word a digital output signal 524 representative of the phase of the input signals received at the first input terminal 502 and the second input terminal 504. The register 510 also has a clock terminal that receives a clock signal 513 at a sampling frequency $F_s$. The clock signal 513 may be an external clock signal.

In this example, the first input terminal 502 is connected to the input terminal of a first sample-and-hold (S/H) component 506. The first S/H component 506 is clocked such that it holds the sampled value of the first input signal for a period of time that corresponds to the sampling period 1/$F_s$. Similarly, the second input terminal 504 is connected to the input terminal of a second sample-and-hold (S/H) component 508. The second S/H component 508 is clocked in the same way as the first S/H component 506. The first S/H component 506 and the second S/H component 508 are clocked synchronously by the same clock signal 513 that is also provided to the register 510. In this way, the first S/H component 506 and the second S/H component 508 generate time-discrete continuous-amplitude signals that are used as reference signals by a first reference signal generator 512 and a second reference signal generator 514 respectively. Use of the S/H components 502, 504 can advantageously reduce or eliminate any variations in the analogue input signals that would cause an inaccuracy in the subsequent processing.

Two sample and hold sub-systems to acquire the in-phase and the quadrature signals I and Q, and to hold the voltage signals during the conversion. The generated time-discrete continuous-amplitude signals I and Q are used as reference, respectively for the DAC1 and DAC2.

The output of the first S/H component 506 is connected to an input of the first reference signal generator 512. The first reference signal generator 512 also has another input that is connected to the register 510 in order to receive the digital word 522. In this example the first reference signal generator is a first DAC 512. The first DAC 512 provides a first analogue reference signal 516 as the product of the first analogue signal and sin(2π*digital word). That is, the first DAC 512 applies a non-linear gain. The reason why the non-linear gain of the first DAC 512 is set as sin(2π*digital word) in this example will be described in more detail below.

The output of the second S/H component 506 is connected to an input of the second reference signal generator 514. The second reference signal generator 514 also has another input that is connected to the register 510 in order to receive the digital word 522.

In this example the second reference signal generator is a second DAC 514. The second DAC 514 provides a second analogue reference signal 518 as the product of the second analogue signal and cos(2π*digital word). That is, the second DAC 514 also applies a non-linear gain. The reason why the non-linear gain of the second DAC 514 is set as cos(2π*digital word) in this example will be described in more detail below.

The phase estimator 500 also has a comparator 520 having a first comparator input terminal and a second comparator input terminal. The first comparator input terminal is connected to the output terminal of the first DAC 512. The second comparator input terminal is connected to the output terminal of the second DAC 514. In this example the first comparator input terminal is an inverting input and the second comparator input terminal is a non-inverting input. The comparator 52 has a comparator output terminal that is connected to the register input terminal 524. In this way, the comparator 520 compares the first analogue reference signal 516 with the second analogue reference signal 518 and provides to the register input terminal 524 of the register 510 a binary feedback signal 530 in the form of logic levels in accordance with the result of the comparison, wherein the binary feedback signal 530 is in the form of logic levels. That is, either a zero or a one is provided to the register input terminal 524 depending upon whether or not the first analogue reference signal 516 is greater than the second analogue reference signal 518.

The register 510 updates the digital output signal 524 at the sampling frequency $F_s$. In order to achieve this functionality the pointer value is periodically incremented in accordance with an internal asynchronous clock at a frequency of $N*F_s$ such that each bit in the digital word is updated in sequence during a single period of the clock signal 513 at the sampling frequency $F_s$. Each bit is updated in accordance with the binary feedback signal received from the comparator output terminal.

As will be described below, the phase estimator 500 of FIG. 5 can provide an analogue I&Q to digital phase conversion scheme that employs a successive approximation algorithm to perform a binary search in the complex plane through all possible phase angle quantization levels before converging upon a digital output for each conversion. If we denote the phase of the complex analogue signal $V_{in}=I+jQ$ as φ=(a tan (Q/I))/2π, then the result of this binary search is a digital signal:

$$\phi = \frac{(2^0\phi_0 + 2^1\phi_1 + \ldots + 2^{N-1}\phi_{N-1})}{2^N}$$

representing the analogue phase φ.

Phase estimation can be performed by the phase estimator 500 of FIG. 5 in the following way:

1. The first S/H component 506 and the second S/H component 508 are used to sample and hold the respective input signals.
2. All the bits of the digital word stored in the register 510 are set to the logic level low, with the exception of the most significant bit (MSB) which is set to the logic level high. At the beginning of any conversion, before any iteration is performed, a reset signal is provided that sets the register to the default word 1000000 . . . 000.
3. Next, the conversion process occurs. If the comparator 520 outputs a logic level low then the MSB of the digital word stored in the register 510 is set to zero because the pointer value causes the binary feedback signal 530 to the written to the ($\phi_{N-1}$) bit in the register 510. All remaining bits are kept at the logic level low. This corresponds to a rotation of π of the phasor P=I sin(2πφ)−jQ cos(2πφ). Alternatively, if the comparator 520 outputs a logic level high, then no phase rotation is required. Setting the MSB of the digital word in this way causes the subsequent iterations for the remaining bits in the digital word to be focussed on the correct half of the complex plane. That is, the first iteration narrows the scope of the following iterations to the correct n radians of the phase value.
4. The remaining N−1 bits of the digital word are set one after the other in accordance with the binary feedback 530 provided at the comparator output terminal in decreasing order from $\phi_{N-2}$ until the least significant bit (LSB) $\phi_0$. Of course, for each subsequent iteration the latest version of the digital word stored in the register 510 is used by the first DAC 512 and the second DAC 514. In this way, each iteration step i corresponds a rotation of P radians in the complex plane by an angle equal to $\pi/2^{N-1}$.
5. As indicated above, all of the decisions of the comparator 520 (the values of the binary feedback signal 530 for each iteration) are stored into the register 510. After N successive iterations the digital word stored in the register is read as the output signal 524 at the output terminal of the register 510. The digital word stored in the register is then reset to the initial value in the same way as step 2 above. A new conversion can then take place by repeating steps 1 to 4.

The phase estimation implements a binary search of angle phase in the complex plane. It is possible to demonstrate that within N iterations, the voltages at the first and second comparator input terminals converge to a differential voltage approximately equal to zero, or at least as close as possible given the resolution of the first DAC 512 and the second DAC 514. By doing so, the signal I sin(2πφ) converges to Q cos (2πφ). Therefore, from I sin(2πφ)≈Q cos(2πφ) it follows that:

$$\frac{(2^0\phi_0 + 2^1\phi_1 + \ldots + 2^{N-1}\phi_{N-1})}{2^N} = \phi \approx \frac{1}{2\pi}a\tan\left(\frac{Q}{I}\right) = \varphi \quad (4)$$

Equation (4) indicates that φ is the digital representation of the analogue phase φ.

The adopted scheme can address the limits of other phase ADC architectures acting from in a number of ways. For example, the use of a successive approximation scheme can achieve an inherently high resolution, thereby relaxing the constraint on the offset of the comparator 520 offset. The phase resolution achievable may be limited by the offset of the comparator in systems that use flash ADCs. Also, the binary search of the angle phase in the mixed-signal domain can use very simple logic to implement the register and therefore can avoid a need for complex digital logic such as CORDIC. In turn, this can save power and silicon area and remove or reduce any latency that may be caused by a cascaded digital subsystem.

Advantageously, the first DAC 512 and the second DAC 514, that both apply non-linear gains, can be implemented by using approximation of the sine and cosine gains of rational functions:

$$\sin\left(\phi\frac{\pi}{2}\right) \approx (1+\kappa)\frac{\phi}{\phi+\kappa} \quad \cos\left(\phi\frac{\pi}{2}\right) \approx (1+\kappa)\frac{1-\phi}{1-\phi+\kappa} \quad (5)$$

where $\phi \in [0,1)$ and K is a fixed parameter that can optimized to reduce the phase estimation error, discussed below. Rational functions can be easy to implement in the analogue domain using simple voltage or current dividers. Voltage and current dividers can be robust to process spread due to their matching properties.

The digital parameter $\phi$ ranges between zero and unity, corresponding to phase angles from 0° to 90°. However, advantageously, the same function can be used to approximate the sine and cosine functions in the full phase angle range from 0° to 360° degrees by simple trigonometric functions. For the sine function it follows:

$$\sin\left(\phi\frac{\pi}{2}\right) \approx (1+\kappa)\frac{\phi}{\phi+\kappa} \qquad [0°, 90°] \quad (6)$$

$$\sin\left(\frac{\pi}{2}+\phi\frac{\pi}{2}\right) = \cos\left(\phi\frac{\pi}{2}\right) \approx (1+\kappa)\frac{1-\phi}{1-\phi-\kappa} \qquad [90°, 180°]$$

$$\sin\left(\pi+\phi\frac{\pi}{2}\right) = -\sin\left(\phi\frac{\pi}{2}\right) \approx -(1+\kappa)\frac{\phi}{\phi+\kappa} \qquad [180°, 270°]$$

$$\sin\left(\frac{3}{2}\pi+\phi\frac{\pi}{2}\right) = -\cos\left(\phi\frac{\pi}{2}\right) \approx -(1+\kappa)\frac{1-\phi}{1-\phi-\kappa} \qquad [270°, 360°]$$

Conveniently, equation (6) can also be extended to the cosine function. In summary, a set of equations that can be used in each of the four quadrants to approximate the non-linear sine and cosine gains of the first DAC 512 and the second DAC 514 are:

$$\sin\left(\phi\frac{\pi}{2}\right) \approx (1+\kappa)\frac{\phi}{\phi+\kappa}, \qquad \cos\left(\phi\frac{\pi}{2}\right) \approx (1+\kappa)\frac{1-\phi}{1-\phi+\kappa} \quad (7)$$

$$\sin\left(\frac{\pi}{2}+\phi\frac{\pi}{2}\right) \approx (1+\kappa)\frac{1-\phi}{1-\phi+\kappa}, \qquad \cos\left(\frac{\pi}{2}+\phi\frac{\pi}{2}\right) \approx -(1+\kappa)\frac{\phi}{\phi+\kappa}$$

$$\sin\left(\pi+\phi\frac{\pi}{2}\right) \approx -(1+\kappa)\frac{\phi}{\phi+\kappa}, \qquad \cos\left(\pi+\phi\frac{\pi}{2}\right) \approx -(1+\kappa)\frac{1-\phi}{1-\phi+\kappa}$$

$$\sin\left(\frac{3}{2}\pi+\phi\frac{\pi}{2}\right) \approx -(1+\kappa)\frac{1-\phi}{1-\phi+\kappa}, \quad \cos\left(\frac{3}{2}\pi+\phi\frac{\pi}{2}\right) \approx (1+\kappa)\frac{\phi}{\phi+\kappa}$$

From inspection of equation (7) it can be seen that the extension from the range [0°, 90°] to the range [90°, 180°] can be achieved easily by inverting each bit of the digital parameter $\phi$ for the DAC1 and inverting the analogue reference and each bit of the digital parameter $\phi$ for the DAC2. The range [180°, 270°] can be achieved by inverting both the analogue references for DAC1 and DAC2. In practice the analogue references can simply be inverted by switching I (the in-phase signal) to its differential counterpart −I or by switching Q (the quadrature signal) to its differential counterpart −Q, as appropriate. Finally the range [270°, 360°] can be implemented by inverting I and inverting $\phi$ for the DAC1 and inverting $\phi$ for the DAC2. FIGS. 6a and 6b show graphically the sine and cosine approximations of equation (7), for $\kappa$=0.6. FIG. 6a shows an ideal sine function 602 and the approximation of the sine function 604 of equation (7). FIG. 6b shows an ideal cosine function 606 and the approximation of the cosine function 608 of equation (7).

In examples that use the approximation to rational functions, the discrepancy between the ideal functions 602, 606 and the approximations 604, 608 of the functions can introduce systematic phase and gain errors. Any error in the gain values may not be a concern to the phase estimators described in this document as it is only the value for the phase that is being estimated. It can be beneficial however to minimise, or reduce to an acceptably low level, the phase error. The phase error $\Delta\phi$ is given by:

$$\Delta\varphi = \frac{\pi}{2}\phi - a\tan\frac{\phi}{\phi+\kappa}\frac{1-\phi+\kappa}{1-\phi} \quad (8)$$

It can therefore be derived that the phase error $\Delta\phi$ is minimized for $\kappa \approx 1.8$, which gives the minimum achievable phase error for the phase estimator of FIG. 5 as $\Delta\phi_{min} \approx 0.031°$. Therefore, the phase estimator of FIG. 5 can achieve a theoretical maximum accuracy of 13.5 bits, which can be considered acceptable for many applications.

FIG. 7a illustrates a digitally-controlled resistive voltage divider, which is one example implementation for providing a sine function approximation. FIG. 7b illustrates another digitally-controlled resistive voltage divider, which is an example implementation for providing a cosine function approximation. The sine function approximation can be used by the first DAC of FIG. 5. The cosine function approximation can be used by the second DAC of FIG. 5.

FIG. 7a has an input terminal $V_{IN}$ 702, an output terminal $V_{OUT}$ 704 and a ground terminal 706. A fixed resistor 710 is connected between $V_{IN}$ 702 and $V_{OUT}$ 704. In the left-hand drawing of this example, the fixed resistor 710 has a resistance value of 1.8R, which corresponds to $\kappa$=1.8 in equations (7) above. A digitally controlled variable resistor 708 is connected between $V_{OUT}$ 704 and the ground terminal 706. The digitally controlled variable resistor 708 is controlled to have a resistance value of $\phi$R, where $\phi$ is $\phi \in [0,1)$ the digital word that is stored in the register of FIG. 5.

The right-hand side of FIG. 7a shows an example implementation of the circuit shown on the left-hand side of FIG. 7a with a digitally controlled variable resistor 708' that is controlled in accordance with an N bit digital word $\phi$, such that $\phi$ ranges between 1 and 2^N. To account for the additional values of the digitally controlled variable resistor 708', the fixed resistor 710' has a resistance value of $1.8 \times 2^N R$. The digitally controlled variable resistor 708' can be embodied as a plurality of resistors in series, including:

a fixed resistor 712 with a resistance value of R; and
one resistor 714 for each of the bits in the digital word, wherein each of these resistors 714 has a resistance value equal to $2^{bit\_position}R$, where bit_position is the position of the associated bit in the digital word and has a value between 0 for the least significant bit (LSB) and N−1 for the most significant bit (MSB). Also each of these resistors 714 is in parallel with a bypass switch 716 that is controlled in accordance with the value of the associated bit $\phi_{bit\_position}$. When the associated bit is a 1, the bypass switch 716 is opened such that the resistor 714 contributes to the value of the digitally controller variable resistor 708. When the associated bit is a 0, the bypass switch 716 is closed such that the resistor 714 is bypassed and does not contribute to the value of the digitally controller variable resistor 708. In this way, the digitally controlled variable resistor 708 can be considered to consist of binary weighted series resistors in parallel with switches.

FIG. 7a illustrates that:

$$V_{OUT} = \frac{\phi}{\phi + 1.8} V_{IN} \quad (9)$$

FIG. 7b is the same as FIG. 7a, except that the digitally controlled variable resistor 728 is controlled to have a resistance value of $(1-\phi)R$, where $\phi$ is the digital word that is stored in the register of FIG. 5.

The right-hand side of FIG. 7b shows an example implementation of how the required resistance value of $(1-\phi)R$ can be achieved for an N-bit digital word $\phi$. In contrast to FIG. 7, the bypass switches 736 are controlled in accordance with the inverse value of the associated bit $\phi_{bit\_position}$. Therefore, when the associated bit is a 0, the bypass switch 736 is opened such that the resistor 734 contributes to the value of the digitally controller variable resistor 728. When the associated bit is a 1, the bypass switch 736 is closed such that the resistor 734 is bypassed and does not contribute to the value of the digitally controller variable resistor 728.

FIG. 7b illustrates that:

$$V_{OUT} = \frac{1-\phi}{1-\phi + 1.8} V_{IN} \quad (10)$$

It can be seen that equations (9) and (10) correspond to those introduced above in equation (7), except for the proportional part of equations (7), which is not important for phase estimation. Also, it can be seen the output voltage $V_{OUT}$ depends only on the ratio of resistor values, which can be accurately controlled in modern CMOS technology.

The circuits of FIGS. 7a and 7b can take advantage of the strength of analogue circuits in making voltage dividers. One reason for using a rational function as approximation to sine and cosine gains is the ease of implementation.

It will be appreciated by the skilled person that the approximated sine and cosine functions can also be conveniently implemented in the current domain by means of switchable binary weighted current mirrors in a similar way to the voltage dividers of FIGS. 7a and 7b.

FIG. 8a illustrates a digitally-controlled charge redistribution voltage divider, which is one example implementation for providing a sine function approximation. FIG. 8b illustrates another digitally-controlled charge redistribution voltage divider, which is an example implementation for providing a cosine function approximation. FIGS. 8a and 8b are examples of two-phase switched-capacitor circuits.

FIG. 8a has an input terminal I 802, an output terminal $V_{OUT}$ 804 and a ground terminal 806. The input terminal 802 is connected to the first terminal of a first switch 808. A second terminal of the first switch 808 is connected to the first plate of a digitally controlled variable capacitor 810. A second plate of the variable capacitor 810 is connected to the ground terminal 806. The variable capacitor 810 is controlled such that it has a capacitance value of $\phi C$ where $\phi$ is the digital word that is stored in the register of FIG. 5. The variable capacitor can be implemented as a simple binary-weighted capacitor bank.

The second terminal of the first switch 808 is also connected to a first terminal of a second switch 812. A second terminal of the second switch 814 is connected to a first terminal of a third switch 814. A second terminal of the third switch 814 is connected to the ground terminal 806. The second terminal of the second switch 812 is also connected to the first plate of a fixed capacitor 816. A second plate of the fixed capacitor 816 is connected to the ground terminal 806. In this example, the fixed capacitor 716 has a capacitance value of 1.8C, which corresponds to κ=1.8 in equations (7) above.

The first plate of the fixed capacitor 816 is also connected to a first terminal of a fourth switch 818. A second terminal of the fourth switch 818 is connected to the output terminal $V_{OUT}$ 804.

The first switch 808 and the third switch 814 are controlled in accordance with a first switch control signal A. The second switch 812 and the fourth switch 818 are controlled in accordance with a second switch control signal B. The first switch control signal A is inverse to the second switch control signal B. Moreover, advantageously A and B are set so that they are non-overlapping in order to avoid or reduce charge leakage.

When the first switch control signal A is high such that the associated switches are closed, which may be considered as a first phase A, the variable capacitor 810 is connected to the input terminal 802 I, which causes a certain amount of charge to the stored on the variable capacitor 810. At the same time, the fixed capacitor 816 is discharged to the ground terminal ground 8016. When the second switch control signal B is high such that the associated switches are closed, which may be considered as a second phase B, the variable capacitor 810 is connected to the fixed capacitor 816 such that the charge redistributes until the capacitor voltages are equal. Since charge is conserved, after a finite time the output voltage converges to $$V_{OUT} = \frac{\phi}{\phi + 1.8} I \approx I \frac{1}{2.8} \sin(\phi\pi/2).$$

This voltage can then be used as the output signal of the first DAC1 in FIG. 5 for comparison with the output signal of the second DAC2.

FIG. 8b is the same as FIG. 8a, except that the digitally controlled variable capacitor 830 is controlled to have a capacitance value of $\bar{\phi}C$, where $\bar{\phi}$ is the inverse of the digital word that is stored in the register of FIG. 5. In a similar way to that described above with reference to FIG. 8a, the output voltage converges to $$V_{OUT} = \frac{1-\phi}{1-\phi + 1.8} Q \approx Q \frac{1}{2.8} \cos(\phi\pi/2).$$

This voltage can then be used as the output signal of the second DAC2 in FIG. 5 for comparison with the output signal of the first DAC1.

The circuits of FIGS. 8a and 8b can be used to implement the first DAC and second DAC of FIG. 5 using only capacitors and switches. The circuits of FIGS. 8a and 8b can provide high energy efficiency together with a reasonably high resolution because it is known that CMOS technology can provide good quality switches and capacitors.

FIG. 9 shows another phase estimator 900. The phase estimator 900 of FIG. 9 is similar to the phase estimator of FIG. 5. Functionality and components that are common to both figures will not necessarily be described again with reference to FIG. 9.

The phase estimator 900 includes a DAC 910, a comparator 930 and a register 932. The register 932 stores an N bit digital word, where $\phi_{N-1}$ is the MSB and $\phi_0$ is the LSB.

The phase estimator 900 has the following input terminals:
- a first input terminal 902 configured to receive a first analogue input signal, which in this example is a positive in-phase signal $I_p$;
- a second input terminal 904 configured to receive a second analogue input signal, which in this example is a positive quadrature signal $Q_p$;
- a third input terminal 906 configured to receive a third analogue input signal, which in this example is a negative in-phase signal $I_n$. The negative in-phase signal is the inverse of the positive in-phase signal. The pair of in-phase signals may be readily available as differential outputs from an RF analogue front-end, as shown in, and mentioned with reference to, FIG. 1; and
- a fourth input terminal 908 configured to receive a fourth analogue input signal, which in this example is a negative quadrature signal $Q_n$. Again, the negative quadrature signal is the inverse of the positive quadrature signal, as may be available from an RF analogue front-end.

The DAC 910 includes a first switched-capacitor circuit 918 that is based on the digitally-controlled charge redistribution voltage divider of FIG. 8a, in order to provide a sine function approximation. The DAC 910 also includes a second switched-capacitor circuit 922 that is based on the digitally-controlled charge redistribution voltage divider of FIG. 8b, in order to provide a cosine function approximation. The DAC 910 further includes a third switched-capacitor circuit 938 that is identical to the first switched-capacitor circuit 918, and a fourth switched-capacitor circuit 940 that is identical to the second switched-capacitor circuit 922.

Each of the four input terminals 902, 904, 906, 908 are connected to the input of a sample and hold component in the same way as in FIG. 5. The outputs of the sample and hold components are connected to four sampled input terminals of the DAC 910. More particularly: the first input terminal 902 is connected to the input terminal of the first switched-capacitor circuit 918 via a sample-and-hold component; the second input terminal 904 is connected to the input terminal of the second switched-capacitor circuit 922 via a sample-and-hold component; the third input terminal 906 is connected to the input terminal of the third switched-capacitor circuit 938 via a sample-and-hold component; and the fourth input terminal 908 is connected to the input terminal of the fourth switched-capacitor circuit 940 via a sample-and-hold component.

Each of the first and third switched-capacitor circuits 918, 938 has a variable capacitor 942, in the same way as the corresponding circuit of FIG. 8a. A plurality of exclusive-or (XOR) gates are provided in parallel to control the capacitance value of the variable capacitor 942, although a single XOR gate 920 is shown in FIG. 9 to assist clarity. More particularly, N−2 parallel XOR gates are provided for each of the switched-capacitor circuit, with the output of each XOR gate being used to either include or exclude a capacitor in a switched capacitor bank. A first input to each of the plurality of XOR gates 920 is hard-coded as the second most significant bit ($\phi_{N-2}$) of the digital word stored in the register 932. A second input to each of the plurality of XOR gates of the first and third switched-capacitor circuits 918, 938 receives one of the $\phi_0$ to $\phi_{N-3}$ bits from the digital word stored in memory. As discussed herein, one of these bits changes for each iteration of the conversion process.

Each of the second and fourth switched-capacitor circuits 922, 940 has a variable capacitor, in the same way as the corresponding circuit of FIG. 8b. A plurality of exclusive-or (XOR) gates are provided in parallel to control the capacitance value of the variable capacitor, although a single XOR gate is shown in FIG. 9 to assist clarity. More particularly, N−2 parallel XOR gates are provided for each of the switched-capacitor circuit, with the output of each XOR gate being used to either include or exclude a capacitor in a switched capacitor bank. Again, a first input to each of the plurality of XOR gates is hard-coded as the second most significant bit ($\phi_{N-2}$) of the digital word stored in the register 932. A second input to each of the plurality of XOR gates of the second and fourth switched-capacitor circuits 922, 940 receives the inverse of one of the $\phi_0$ to $\phi_{N-3}$ bits from the digital word stored in memory. This inverse i functionality can be provided by a NOT gate 924 at the input to the XOR gate, such that the input of the NOT gate 924 receives a bit from the digital word in the register 932 and the output of the NOT gate 934 is connected to the second input of each of the XOR gates. As will be appreciated from the description of FIGS. 8a and 8b, the use of the NOT gate 924 converts the approximation that is provided by the switched-capacitor circuit from a sine function to a cosine function.

The outputs of the four switched-capacitor circuits 918, 922, 938, 940 are connected to respective inputs of a multiplexer (MUX) 912. The MUX 912 is used to pass either the output signal from the first switched-capacitor circuit 918 or the third switched-capacitor circuit 938 to an in-phase output terminal 928 of the MUX 912. The MUX 912 is also used to pass either the output signal from the third switched-capacitor circuit 938 or the fourth switched-capacitor circuit 940 to a quadrature output terminal 926 of the MUX 912. As will be recalled from equations (7) above, the switched-capacitor circuit should use either a negative or positive analogue signal in accordance with the quadrant in the complex plane that the phase value occurs, in order to properly approximate the sine or cosine gain functions. Therefore, the MUX 912 has two control input terminals 914, 916: a first control input terminal 916 that is hard-coded to receive the MSB ($\phi_{N-1}$); and a second control input terminal 914 that is hard-coded to receive the second most significant bit ($\phi_{N-2}$) of the digital word stored in the register 932. The MSB ($\phi_{N-1}$) represents which half of the complex plane the phase value is assumed to exist in, and the second most significant bit ($\phi_{N-2}$) represents which quadrant of the complex plane the phase value is assumed to exist in. In other words, the MSB applies a 180° rotation to a phasor in the complex plane that is indicative of the estimated phase and the second most significant bit ($\phi_{N-2}$) applies a 90° rotation to the phasor.

The in-phase output terminal 928 and the quadrature output terminal 926 are respectively connected to a negative input terminal and a positive input terminal of the comparator 930 in the same way as in FIG. 5. The output of the comparator 930 is configured to sequentially write either a 0 or a 1 to the $i^{th}$ bit in the digital word stored in the register 932. The register 932 in this example provides the digital word 936 as it is stored in the register 932 on a parallel bus to the DAC 910. In other examples, the register 932 may provide the digital word serially and the DAC 910 may be configure to store all the bits ($\phi_{N-1}$ to $\phi_0$) for use with subsequent iterations of a conversion process, as required. All of the bits can be used during conversion, although only one bit may be updated for each iteration.

The phase estimator 900 of FIG. 9 can be considered as a charge redistribution SAR phase ADC that uses four banks of capacitors 918, 922, 938, 940 to realize the sine and cosine approximation over the full phase angle range from 0° to 360°. The inputs of the respective banks of capacitors 918, 922, 938, 940 are connected to the two differential I and Q analogue signals ($I_p$, $I_n$, $Q_p$ and $Q_n$) through four sample and hold sub-systems (or equivalently two differential sample and hold sub-systems). The MSB ($\phi_{N-1}$) and MSB-1 ($\phi_{N-2}$) are used to select one out of four quadrants in the complex plane by means of a multiplexer 912. Therefore, $\phi_{N-1}$ and $\phi_{N-2}$ can allow rotation of a comparator input phasor P=I sin(2π$\phi$)−j Q cos(2π$\phi$) by a phase angle of 0 ($\phi_{N-1}$=0 $\phi_{N-2}$=0)90° ($\phi_{N-1}$=1 $\phi_{N-2}$=0), 180° ($\phi_{N-1}$=0 $\phi_{N-2}$=1), and 270° ($\phi_{N-1}$=1 $\phi_{N-2}$=1) according to equation (7). The remaining bits $\phi_{N-i}$ with i∈[3, N] performs a rotation of 180°/2^(i−1) by using the sine and cosine weightings described above.

Advantageously, the phase estimator 900 of FIG. 9 requires only one DAC 910 working in the complex plane with a total capacitance value of 2.8×2^N×C where 'C' is the unit capacitor and N is the resolution of the ADC. The amount of charge on the capacitors in the array is used to perform the phase angle binary search in conjunction with a comparator 930 and a register (on this example a successive approximation register (SAR)) as described above. By increasing both the number of SAR iterations and the DAC resolution N, the phase quantization error decreases, thus improving the resolution of the analogue to digital conversion.

The conversion method for the system of FIG. 9 follows the same rules as for the general phase ADC described above with reference to FIG. 5.

FIGS. 10a to 10e show the results of simulations that were performed on the phase estimator of FIG. 9. Each of FIGS. 10a to 10d show the input signal to the positive input terminal of the comparator (the positive input signal) as a solid line and the input signal to the negative input terminal of the comparator (the negative input signal) as a dashed line. The horizontal axis in each plot represents the number of the iteration that is being performed. In this example the length of the digital word stored in the register, and therefore the number of iterations required to perform a conversion operation is 10.

Figure 10A:
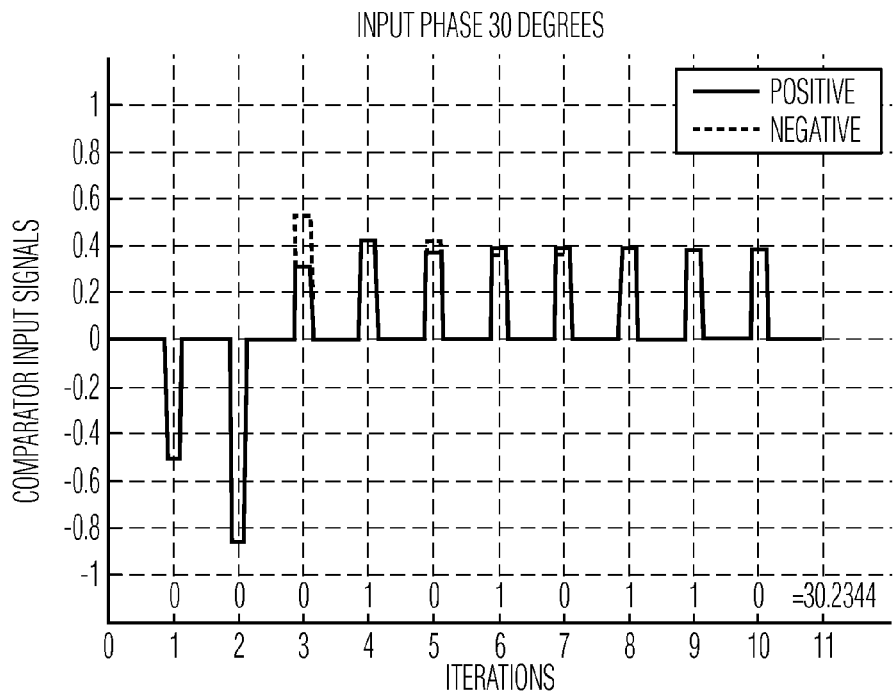

FIG. 10a shows the results for an input signal that has a phase of 30°. For the first iteration (i=1), when the digital word stored in memory will be the default word of 1000000000 (which is the default for the start of each conversion operation), the positive input signal is less than the negative input signal. This causes the output of the comparator to be 0, which is written to the MSB of the digital word stored in the register, as shown just above the horizontal axis of FIG. 10a next to iteration 1. For the second iteration (i=2), first the corresponding bit is set to a default bit value, in this example it is 1, so that the digital word stored in memory is now 0100000000, the positive input signal is again less than the negative input signal. This causes the output of the comparator to be 0, which is written to MSB-1 position of the digital word stored in the register, as shown just above the horizontal axis of FIG. 10a next to iteration 2. The fact that the first two bits of the digital word in this example have been written as 00 is indicative that the phase angle will be in the first quadrant (between 0° and 90°).

Moving on to the fourth iteration (i=4), when the digital word stored in memory will be 0000000000, the iteration starts by setting the corresponding bit to 1 again so that the digital word is 0001000000. Here, the positive input signal is greater than the negative input signal, which causes the output of the comparator to be 1. This causes the 4$^{th}$ MSB of the digital word stored in the register to be left as 1, as shown just above the horizontal axis of FIG. 10a next to iteration 1. At this stage in the conversion operation, the digital word stored in memory will be 0001000000. Iteration 5 will start with Ser. No. 00/011,00000 and the process will continue in the same fashion until the LSB.

As can be seen in FIG. 10a, the values for the positive input signal and the negative input signal get closer together with each iteration as the conversion process hones in on the phase angle of the received analogue signal.

As shown in FIG. 10a, once all 11 iterations of the conversion operation have been performed, the digital word stored in the register is 0001010110. This digital word is representative of the phase of the received analogue signals. 0001010110 is representative of the decimal number 86. Thus the phase is in degrees is determined as 86/1024*360=30.2344°. It can be seen that the conversion operation with a digital word of length N=10 provides a high level of accuracy as the phase estimator returns a value of 30.2344° for the received signal with a phase of 30°.

Figure 10B:
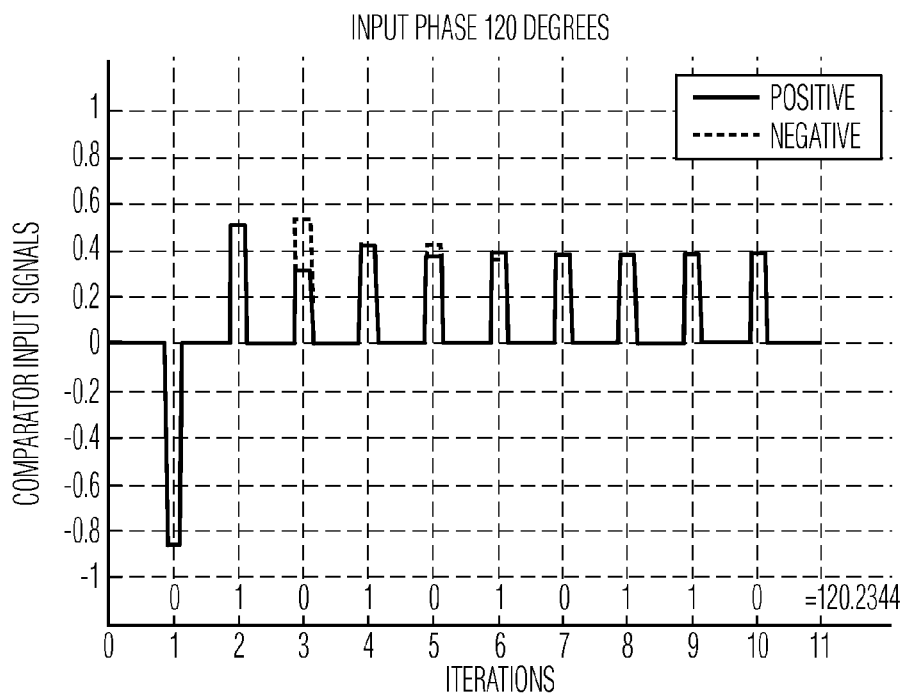

FIG. 10b shows the results for an input signal that has a phase of 120°. The phase estimator returns an estimated phase value of 120.2344°. The first two bits of the digital word are 01, which is indicative that the phase angle is in the second quadrant (between 90° and 180°).

Figure 10C:
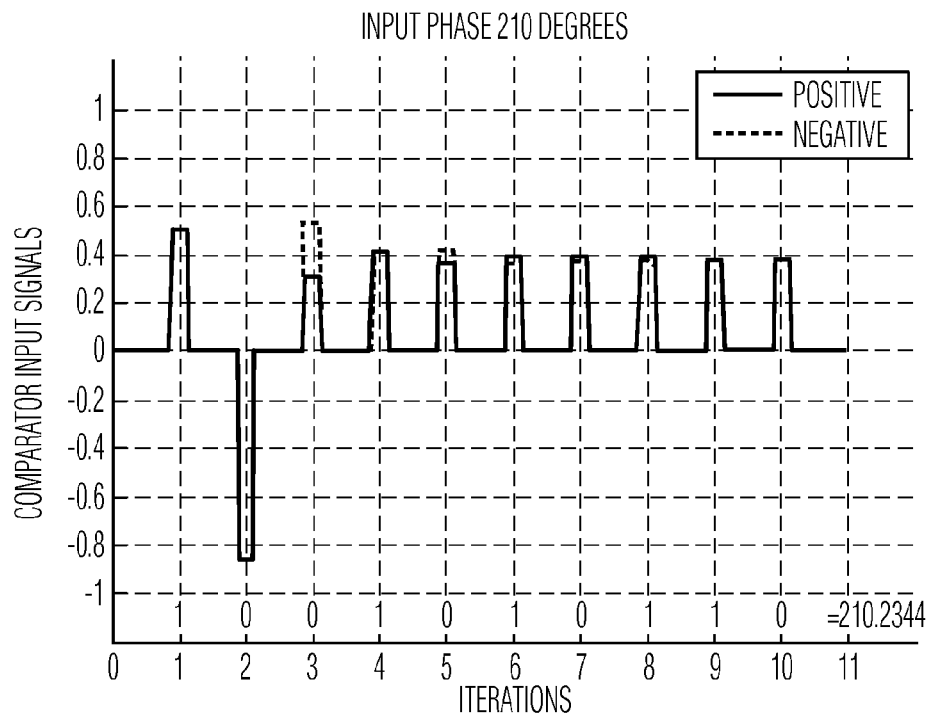

FIG. 10c shows the results for an input signal that has a phase of 210°. The phase estimator returns an estimated phase value of 210.2344°. The first two bits of the digital word are 10, which is indicative that the phase angle is in the third quadrant (between 180° and 270°).

Figure 10D:
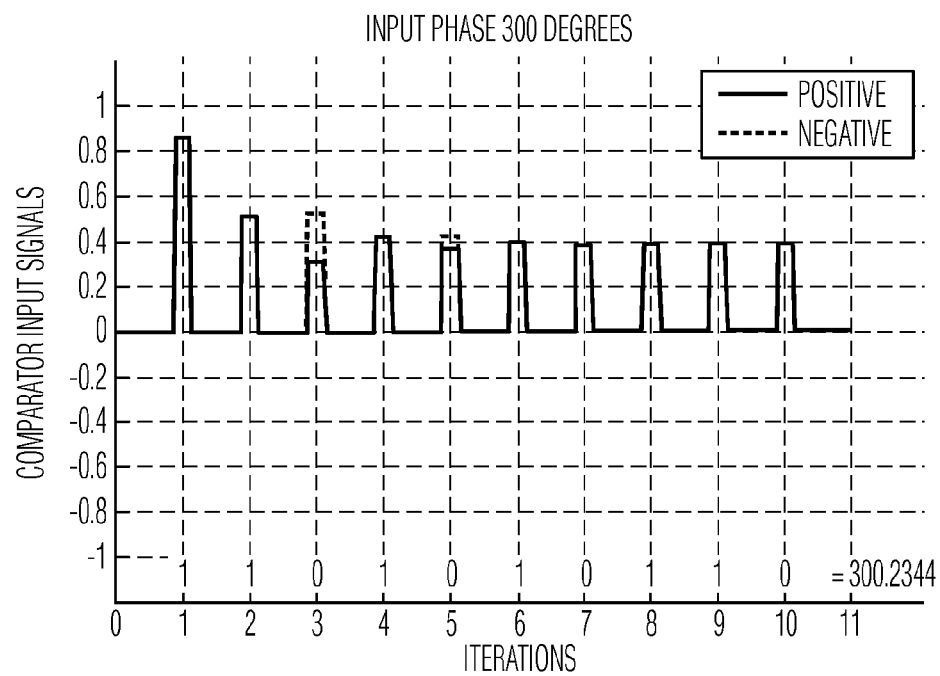

FIG. 10d shows the results for an input signal that has a phase of 300°. The phase estimator returns an estimated phase value of 300.2344°. The first two bits of the digital word are 11, which is indicative that the phase angle is in the fourth quadrant (between 270° and 360°).

Figure 10E:
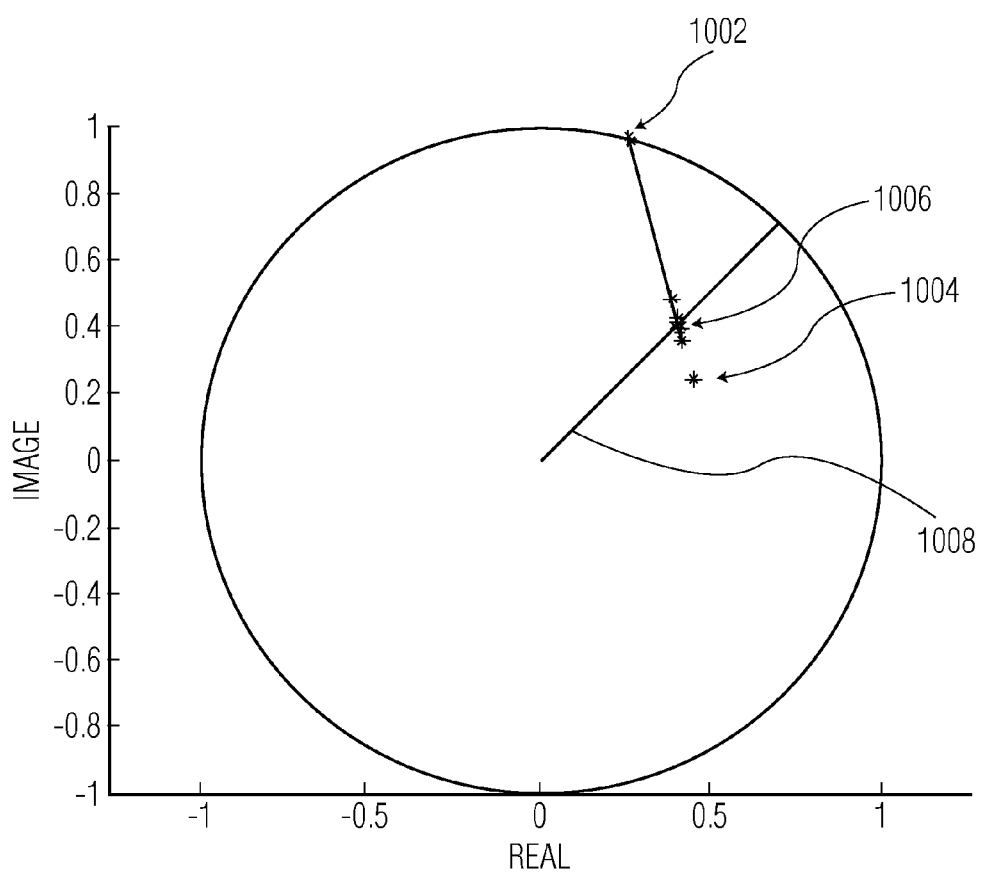

FIG. 10e shows simulation results in the complex plane. The actual phase angle is shown by radius 1008. The initial phase value of the Phasor before the first iteration is shown with reference 1002 (I quadrant case is shown in this example). The Phasor phase value after the final iteration is shown with reference 1006 (I=Q). The intermediate Phasor phase value after a number of intermediate iterations are shown in FIG. 10e, one example of which is shown with reference 1004. As with the examples of FIGS. 10a to 10d, the Phasor phase value gets ever closer to the phase angle 45 degrees 1008 with each iteration. Since the final value is always 45 degrees and we keep memory of the phase rotations needed to achieve that point in the register, that value corresponds to the input Phasor phase as described earlier. As mentioned above, the distance/amplitude between the centre of the complex plane and the final phasor amplitude value does not matter, as we are only interested in the phase angle in some examples.

FIG. 11 shows the results of more simulations of the phase estimator of FIG. 9. The left-hand plot of FIG. 11 shows the phase error versus input phase in the case of a digital word with length (N=10). The right-hand plot of FIG. 11 shows the maximum phase error as function of the number of iterations. The minimum theoretical achievable phase error is $\Delta\phi_{min}$≈0.031°. As described above, this is due to the approximation of the sine and consine functions, as shown in FIGS. 6a and 6b. In practical implementations, however, the main source of phase error can be component mismatch between the capacitor banks used in the DAC. Therefore in some examples, it has been found that any more than 11 iterations (N=11) may provide limited or no improvement in the accuracy of the phase estimation.

FIG. 12 shows circuit level simulations of the phase estimator of FIG. 9, with a 10-bit digital word. An input tone of 1 kHz was used as input while the external clock is 2 MHz. The converted digital output is shown in the bottom-left plot and resembles, as expected, a linear phase increasing over time with a slope of 1024/1024us=1 kHz. The associated integral non-linearity (INL) shown on the right-hand side of FIG. 12 is better than 0.5 LSBs.

One or more of the examples disclosed herein can provide a novel technique and novel electronic circuit to convert two analogue quadrature signals into a digital signal representing their absolute phase in the mixed-signal domain. Advantageously, the circuit may avoid the need for a CORDIC and may use one single ADC. This can result in a significant improvement in terms of power and area requirements for a given phase accuracy. Furthermore, the circuits and techniques can be flexible such that they allow adaptive phase estimation systems to be provided that consume more power only when very high accuracy is required while reducing the power consumption for applications where the phase accuracy is relaxed.

Examples disclosed herein can be used in any systems that requires a low-cost ultra-low-power fast and accurate phase estimation. Such applications include ultra-low-power RF tuners and digital RPM magnetic sensors.

Circuits and methods disclosed herein can provide a mixed-signal algorithm for a conversion from two analogue quadrature signals to a digital signal representing the absolute analogue phase via a binary search of the phase angle in the complex plane. A SAR Phase ADC can be used to employ the proposed algorithm to implement an energy-efficient, low-cost and reasonable high accuracy is described:

The employment of the proposed SAR Phase ADC into an RF Tuner enables a low-cost, fast and ultra-low-power synchronization sub-system. Moreover, it allows easy demodulation of high order phase and frequency modulation schemes by using simple hardware and by avoiding an expensive and power-consuming digital CORDIC. Also, the adoption of two magnetic sensors cascaded with the proposed SAR Phase ADC enables an ultra-low-power, high-dynamic-range and low-cost digital RPM sensor. The differentiated digital output is proportional to the measured revolutions per minute of the rotor and it can be easy to interface to a digital actuator. Additionally, it can be inherently robust to external noise/interferes and it can avoid an expensive and power-hungry microcontroller and/or digital CORDIC.

Furthermore, a Charge Redistribution SAR Phase ADC with high energy efficiency in the conversion from analogue quadrature signals to digital phase while employing a very low-cost hardware can be provided.

One or more of the systems disclosed in this document can be more efficient in terms of silicon area and power consumption versus phase/frequency accuracy than conventional phase extraction systems for both RF Tuners and RPM magnetic sensors. While an approach based on CORDIC has the potential for the highest phase/frequency accuracy, it can require extra digital hardware and it dissipates power. A single phase ADC can demand lower power consumption and less area, because it can extract the useful information directly in the mixed-signal domain without requiring any digital signal processing. However, a phase ADC cannot combine high phase accuracy and high conversion rate with low power consumption.

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. A phase estimator comprising:
   a first input terminal configured to receive a first analogue input signal;
   a second input terminal configured to receive a second analogue input signal, wherein the second analogue input signal is 90° out of phase with the first analogue input signal;
   a register configured to store N bits as a digital word, where N is greater than one, the register comprising a register input terminal that is connectable to each of the bits in accordance with a pointer value, and a register output terminal configured to provide the digital word;
   a first reference signal generator configured to receive the digital word from the register and the first analogue signal, and provide a first analogue reference signal as the product of the first analogue signal and $\sin(2\pi \cdot \text{digital word})$;
   a second reference signal generator configured to receive the digital word from the register and the second analogue signal, and provide a second analogue reference signal as the product of the second analogue signal and $\cos(2\pi \cdot \text{digital word})$;
   a comparator configured to compare the first analogue reference signal with the second analogue reference signal and provide to the input terminal of the register a binary feedback signal in accordance with the result of the comparison; and
   wherein the output terminal of the register is configured to provide the digital word, wherein the digital word is representative of the phase of the first analogue input signal and the second analogue input signal.

2. The phase estimator of claim 1, wherein the phase estimator is configured to set the pointer value to the most significant bit in the digital word, set the digital word to a default word, and then repeatedly:
   a) write the binary feedback signal to a bit in the register in accordance with the pointer value;
   b) increment the pointer value;
   c) for the bit in the register identified by the pointer value, set the bit as a default bit value;
   d) provide a new first analogue reference signal and a new second analogue reference signal in accordance with the digital word stored in the register; and
   e) compare the new first analogue reference signal with the new second analogue reference signal in order to provide to the input terminal of the register a binary feedback signal.

3. The phase estimator of claim 2, further configured to repeat steps a) to e) at a frequency equal to the product of a sampling frequency and N.

4. The phase estimator of claim 3, wherein the output terminal of the register is configured to update the digital word at a frequency equal to the inverse of a sampling period.

5. The phase estimator of claim 2, wherein the most significant bit of the default word is 1 and all other bits are zero, and wherein the default bit value is 1.

6. The phase estimator of claim 1, further comprising a first sample-and-hold component and a second sample-and-hold component, wherein:

the first sample-and-hold component has an input terminal that is connected to the first input terminal and an output terminal that is configured to provide a first time-discrete continuous-amplitude signal to the first reference signal generator; and the second sample-and-hold component has an input terminal that is connected to the second input terminal and an output terminal that is configured to provide a second time-discrete continuous-amplitude signal to the second reference signal generator.

7. The phase estimator of claim 6, wherein the first sample-and-hold component and the second sample-and-hold component are configured to be clocked by a clock signal with a frequency equal to a sampling frequency.

8. The phase estimator of claim 1, wherein the first reference signal generator comprises a first digitally-controlled charge redistribution voltage divider configured to implement a sine function approximation, wherein the first digitally-controlled charge redistribution voltage divider comprises a first digitally controlled variable capacitor and a first fixed capacitor, the first digitally controlled variable capacitor is configured to provide a capacitance value of $\phi C$, where $\phi$ is the digital word that is stored in the register and the first fixed capacitor has a fixed value of about 1.8C.

9. The phase estimator of claim 8, wherein the first digitally controlled variable capacitor comprises a first binary-weighted capacitor bank.

10. The phase estimator of claim 1, wherein the second reference signal generator comprises a second digitally-controlled charge redistribution voltage divider configured to implement a cosine function approximation, wherein the second digitally-controlled charge redistribution voltage divider comprises a second digitally controlled variable capacitor and a second fixed capacitor, the second digitally controlled variable capacitor is configured to provide a capacitance value of $\bar{\phi} C$, where $\bar{\phi}$ is the inverse of the digital word that is stored in the register and the second fixed capacitor has a fixed value of about 1.8C.

11. The phase estimator of claim 1, wherein the first reference signal generator comprises a first digitally-controlled resistive voltage divider configured to implement a sine function approximation, wherein the first digitally-controlled resistor voltage divider comprises a first digitally controlled variable resistor and a first fixed resistor, the first digitally controlled variable resistor is configured to provide a resistor value of $\phi R$, where $\phi$ is the digital word that is stored in the register and the first fixed resistor has a fixed value of about 1.8R.

12. The phase estimator of claim 11, wherein the first digitally controlled variable resistor comprises a first binary-weighted resistor array.

13. The phase estimator of claim 1, wherein the second reference signal generator comprises a second digitally-controlled resistive voltage divider configured to implement a cosine function approximation, wherein the second digitally-controlled resistive voltage divider comprises a second digitally controlled variable resistor and a second fixed resistor, wherein the second digitally controlled variable resistor is configured to provide a resistor value of $\bar{\phi} R$, where $\bar{\phi}$ is the inverse of the digital word that is stored in the register and the second fixed resistor has a fixed value of about 1.8R.

14. An RF tuner comprising the phase estimator of claim 1.

15. An RPM sensor comprising the phase estimator of claim 1.

\* \* \* \* \*